SEMICONDUCTOR PUSH-PULL CIRCUITS UTILIZING MINORITY CARRIER STORAGE EFFECTS

Filed March 25, 1966

INVENTOR
FRANCIS L. O'MALLEY
BY Norman R. Bardales
ATTORNEY

United States Patent Office
3,421,099
Patented Jan. 7, 1969

3,421,099
SEMICONDUCTOR PUSH-PULL CIRCUITS UTILIZING MINORITY CARRIER STORAGE EFFECTS

Francis L. O'Malley, Owego, N.Y., assignor to International Business Machines Corporation, Armonk, N.Y., a corporation of New York Filed Mar. 25, 1966, Ser. No. 537,536
U.S. Cl. 330—15 5 Claims
Int. Cl. H03f *3/26;* H03f *1/38*

ABSTRACT OF THE DISCLOSURE

A semiconductor push-pull circuit which employs a feedback means which in response to a signal produced by the respective minority carrier storages of the semiconductor devices maintains the off semiconductor device in a non-conducting condition during the storage time of the other semiconductor device when the latter is placed in a turned-off condition by the input signal and vice versa.

This invention is related to semiconductor push-pull circuits and more particularly to an improvement which mitigates the deleterious effects of the semiconductors' storage time in such circuits.

As is well known to those skilled in the art, in push-pull circuits which employ a pair of semiconductor devices as the active elements, the normally nonconductive semiconductor devices are alternately rendered conductive in response to an input signal. For example, one kind of push-pull semiconductor circuit is the push-pull power amplifier. In one known type of this circuit, a pair of transistors is utilized as the semiconductor elements, with the transistors generally operated in class B operation, although other modes of operation are also utilized such as class A, class AB, etc. Transistorized push-pull circuits are generally designated by the electrode which is common to the associated input and output circuits such as, for example, as a common-emitter, or a common-base, or a common-collector push-pull circuit. Furthermore, as is well known to those skilled in the art, the transistor elements are generally of the same type, i.e. the transistors are either both NPN or both PNP. However, as is well known to those skilled in the art, push-pull circuits may also employ transistors of opposite types arranged in complementary symmetry. It is also the practice in push-pull circuits, depending on the desired results, to either provide a zero input bias by grounding the input electrode or to provide a biasing voltage thereat. If the common electrode is grounded, it is also in addition generally referred to by this characteristic, e.g. a grounded-emitter push-pull circuit.

In the push-pull circuits of the prior art, a distortion known as cross-over distortion occurs near the cross-over point of the input signal, i.e. just prior or before the point where the phase of the input signal is reversed. For example, in class B operation, when the input signal is in a given phase and is approaching the end of its half-cycle associated with that phase, i.e. before the phase reversal of the input signal, the output waveform becomes distorted due to the non-linear characteristics of the associated conducting semiconductor at or near this point. Various schemes have been accomplished in the prior art to mitigate the effects of cross-over distortion such as, for example, by using a small forward bias on both semiconductors of the push-pull circuit.

However, there is another distortion that results from the storage time of the semiconductors and which generally occurs after the cross-over point or phase reversal of the input signal and it is this distortion with which the present invention is concerned. As is well known to those skilled in the art, storage time occurs or results from injected minority carriers being in the base or gate region of the semiconductor at the time when the input current is cut off. These minority carriers require a definite length of time to be collected. The length of storage time is essentially governed by the degree of saturation in which the semiconductor is driven and of the time spent in saturation. Storage time is also referred to as minority carrier storage. The effects of storage time result in a distortion of the output waveform after the phase reversal of the input signal in a push-pull circuit and are particularly deleterious at high frequency operations as will become apparent hereinafter.

The object of this invention is to provide a semiconductor push-pull circuit which mitigates the deleterious effects of storage time.

Another object of this invention is to provide a semiconductor push-pull circuit wherein the output waveform is a high fidelity replica of the input waveform.

Accordingly, the semiconductor push-pull circuit of the present invention comprises a pair of first and second semiconductor devices. Each of the semiconductor devices have input, output and common electrodes. Input means are coupled to the input and common electrodes of the semiconductor devices and output means are coupled to their output and common electrodes. A source of input signal is coupled to the input means and provides a signal across the input and common electrodes of the first and second semiconductor devices which alternately renders them conductive at their respective outputs. Feedback means are provided which are responsive to each of the respective minority carrier storages of the first and second semiconductor devices to maintain the second semiconductor device in a nonconducting condition during the storage time of the first semiconductor device and to maintain the first semiconductor device in a nonconducting condition during the storage time of the second semiconductor device.

The foregoing and other objects, features and advantages of the invention will be apparent from the following more particular description of the preferred embodiment of the invention as illustrated in the accompanying drawings.

Figure 1:
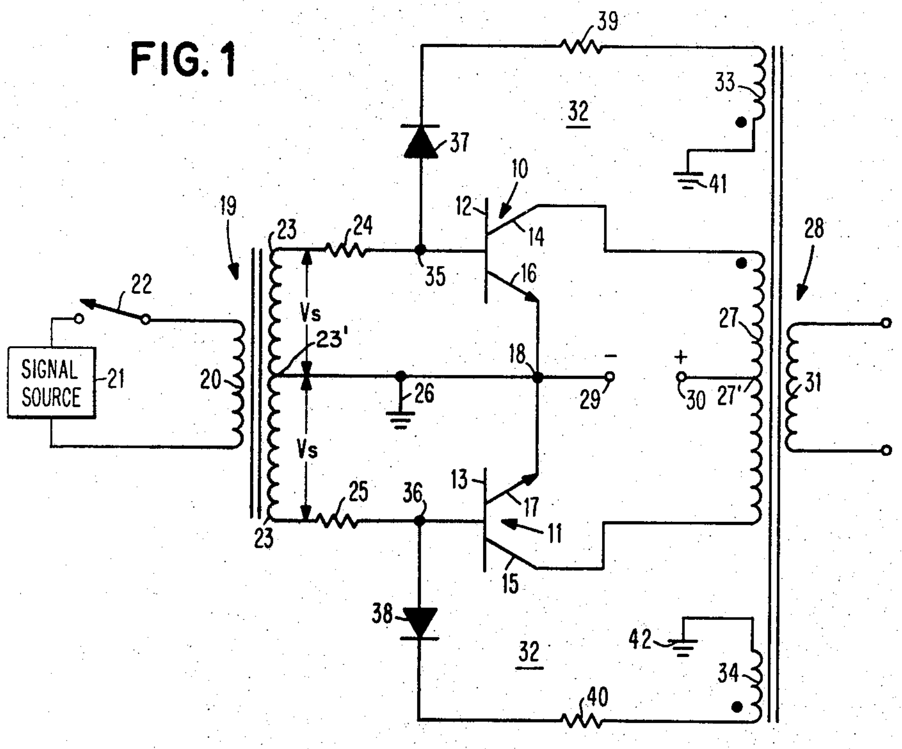
FIG. 1 is a schematic view of a preferred embodiment of the invention.

Referring to FIG. 1, the preferred embodiment of the invention is illustrated as a ground-emitter push-pull amplifier employing class B operation. As such, the circuit comprises a pair of semiconductor devices as the active elements and which in the preferred example use a pair of transistors 10 and 11 having respective base electrodes 12, 13, collector electrodes 14, 15, and emitter electrodes 16, 17, the latter being connected at the common junction 18. An input transformer 19 has an input winding 20 connected to a signal source 21 via switch 22. In the preferred embodiment, when switch 22 is closed the signal source provides an input square wave pulse signal such as is indicated by the waveform (*a*) or (*e*) in FIGS. 2A and 2B, respectively, across the base electrodes 12, 13 thus rendering transistors 10, 11 alternately conductive in a manner which is well known to those skilled in the art. For this purpose, the input transformer 19 has a center tapped output winding 23, the upper end of which is coupled to the base electrode 12 via current limiting resistor 24. The lower end of the winding 23 is connected to the base electrode 13 of the other transistor 11 via current limiting resistor 25. The center tap 23' of winding 23 is connected to the common junction 18 of the emitter electrodes 16, 17 and is grounded by the ground connection 26. In the output circuit, the collector electrodes 14, 15 are connected to the upper and lower ends, respectively, of the input center tap winding 27 of the output transformer 28. The output circuit is biased by a suitable DC voltage source, not shown, which is connected to the input terminals 29, 30, the latter being coupled to the common junction 18 and center tap 27', respectively. By way of example, the transistors 10, 11 of the preferred embodiment are illustrated as being of the same type and are shown therein as being of the NPN types. Consequently, the DC voltage source, not shown, is connected to the terminals 29, 30 with the polarity indicated thereat. The output transformer 28 has a suitable output winding 31.

In order to overcome the deleterious effects of storage time, the circuit of FIG. 1 is provided with feedback means generally indicated by reference numeral 32. The feedback means comprises feedback coils 33, 34, which are connected to the base electrodes 12, 13, respectively, at the respective junctions 35, 36 via the respective diode rectifiers 37, 38 and current limiting resistors 39, 40. The coils 33, 34 are grounded by ground connections 41, 42, respectively.

Figure 2A:
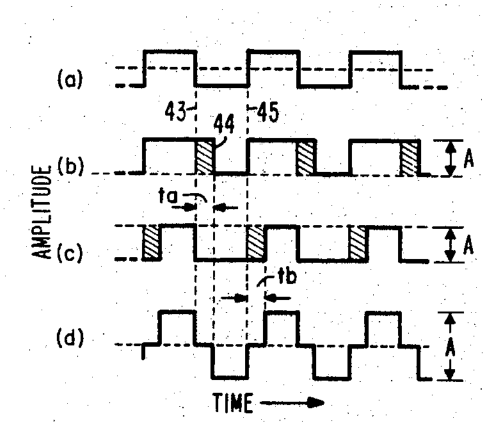
FIGS. 2A and 2B are waveforms utilized to describe the operation of the embodiment of FIG. 1 without and with, respectively, the feedback means 32 shown in FIG. 1.

Referring now to FIG. 2A, the operation of the circuit of FIG. 1 will be explained, it being first assumed for purposes of explanation that the feedback means 32 are not connected. Under this assumption, when the switch 22 is in the closed position, the signal source 21 causes an input signal, waveform (*a*), FIG. 2A, to appear across the base electrodes 12, 13 as aforementioned. As a result, the output from transistor 10 provides a signal as indicated by the waveform (*b*), FIG. 2A. As indicated in FIG. 2A by the waveform (*b*), transistor 10 is conducting during the upper half-cycles of the input signal of waveform (*a*). Likewise, as is well known to those skilled in the art, during this period the transistor 11 is nonconducting, except for an initial portion due to the minority carrier storage of transistor 11 as will become apparent from the description below, the foregoing being indicated by the waveform (*c*) of FIG. 2A. When the input signal, waveform (*a*), crosses over or more properly reverses its phase, as indicated by the reference numeral 43, FIG. 2A, the transistor 10 continues to conduct as indicated by the cross-hatching 44 in waveform (*b*) due to the minority carrier storage in transistor 10. At the same time, transistor 11 commences conduction due to the phase reversal of the input signal and during the time period $t_a$ the cumulative output signal, waveform (*d*) of FIG. 2A, is distorted due to the cancellation of the output current of transistor 11 by the current produced by the minority carrier storage of transistor 10. Consequently, the output signal is distorted, as shown by the waveform (*d*) of FIG. 2A, when the feedback means 32 are not employed. A similar action takes place during the time period $t_b$, FIG. 2A, when the input signal again changes phase at the time indicated by the reference numeral 45. At this time transistor 10 is rendered conductive due to the phase reversal of the input signal and due to the minority carrier storage of transistor 11, the latter remains conductive. As a result, cancellation of the output current of transistor 10 by the current produced by the minority carrier storage of transistor 11 during this time period distorts the cumulative output signal, waveform (*d*) of FIG. 2A. As shown in FIG. 2A, the distortion is cyclic and occurs after each phase reversal of the input signal.

Figure 2B:
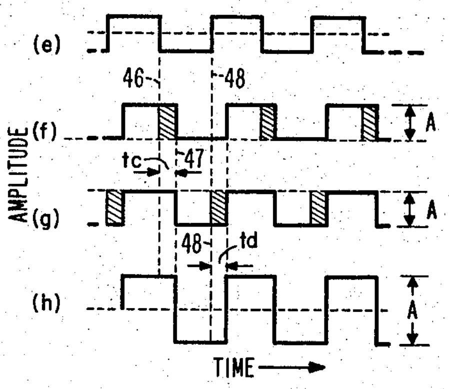

Referring now to FIG. 2B, when the feedback means 32 of the present invention are employed, the operation of the circuit, FIG. 1, is as follows: with the switch 22 in the closed position and the balanced square wave input, waveform (*e*) of FIG. 2B, which is derived from the voltage source 21, is coupled to the input winding 20, transistor 10 is rendered conductive sometime after the commencement of and during each of the upper half-cycles of the input signal, transistor 11 becoming nonconductive when transistor 10 begins to conduct. Similarly, transistor 11 is rendered conductive sometime after the commencement of and during each of the lower half-cycles of the input signal with transistor 10 becoming nonconductive when transistor 11 begins to conduct. By way of explanation, as shown in FIG. 1, the coils 33 and 34 are inductively coupled to the transformer 28 in such a manner that the respective feedback voltages induced into each of the coils are in 180° phase relationship. In addition, the diodes 37 and 38 are so poled that the voltage induced in the feedback coil associated with a nonconducting transistor will cause the associated feedback diode to conduct thereby placing a biasing voltage on that transistor which maintains the transistor in a nonconducting condition. Because of the 180° phase differece in the feedback voltages, the feedback voltage induced in the other feedback coil is of opposite polarity and consequently the diode with which it is associated does not conduct and as a result the feedback voltage induced in the coil does not affect the operation of the conducting transistor. At the time of a phase reversal of the input signal, the nonconducting transistor remains in the nonconducting condition. The minority carrier storage of the conducting transistor induces a voltage into the feedback coil associated with the nonconducting transistor which continues to render the associated feedback rectifier or diode conductive and consequently maintains the nonconducting transistor in a nonconducting condition. Similarly as before, the minority carrier storage of the conducting transistor will cause a voltage to be induced into the feedback coil with which the conducting transistor is associated that is of a polarity opposite to the voltage induced in the other coil and consequently does not render the feedback rectifier, which is associated with the conducting transistor, conductive. As a result, the voltage induced in the feedback coil associated with the conducting transistor and derived from the minority carrier storage of the conducting transistor does not affect the conductive operation of the conducting transistor. When the minority storage time of the conducting transistor becomes negligible, the diode associated with the nonconducting transistor ceases to conduct and consequently the input signal causes this transistor to become conductive and the other transistor to be cut off. Since the output signal of the now conducting transistor is in phase, or polarity, opposition to the output signal which was produced by the now cut-off other transistor when it was previously conducting, the polarities of the feedback voltages induced in the coils are likewise reversed so as to maintain the now cut-off transistor and the feedback diode, which is associated with the now conducting transistor, in their nonconducting conditions until the minority carrier storage of the now conducting transistor becomes negligible after the next phase reversal of the input signal, whereupon the cycle is repeated. As a consequence of the aforedescribed delays in the respective conductions of the transistors, the cumulative output waveform is undistorted as will be apparent from the following discussion of the waveforms of FIG. 2B. Thus, as seen in FIG. 2B, when the input signal reverses phase such as, for example, at the time indicated by the reference numeral 46, the transistor 10 continues to conduct due to its storage during the period $t_c$. During this period $t_c$, the current derived from the minority carrier storage of transistor 10 induces voltages in the feedback coils 33, 34 which provide negative potentials as indicated by the dots shown in FIG. 1. The negative potential which appears across the feedback coil 34 conditions the diode 38 to conduct so as to maintain the transistor 11 in a cut off condition until the current resulting from the minority carrier storage of transistor 10 becomes negligible at the time indicated by the reference numeral 47, FIG. 2B. At the time 47, because of the delay of the conduction of transistor 11, the cumulative output signal, waveform (*h*) of FIG. 2B, is consequently undistorted. A similar action takes place during the time period $t_d$, FIG. 2B, between the transistors 11 and 10 when the input signal again reverses its phase at the time indicated by the reference numeral 48. During the time period $t_d$, the conduction of transistor 10 is delayed by the action of the feedback means associated with the coil 33 and diode 37 in response to the current produced by the minority carrier storage of transistor 11.

A circuit constructed in accordance with the preferred embodiment illustrated in FIG. 1 has the following values:

| | |
|---|---|
| Transistors **10, 11** | Each Type DTS 0710. |
| Diodes **37, 38** | Each Type RG 100 D. |
| Resistors **24, 25** | Each 5.6 ohms. |
| Resistors **39, 40** | Each 1 ohm. |
| DC voltage source, not shown | 150 volts. |
| Voltage $V_s$ | 8 volts. |

While the push-pull circuit embodiment of FIG. 1 has been illustrated as utilizing a particular kind of semiconductor devices, to wit: transistors; a particular kind of circuit, to wit: an amplifier; a particular operational mode, to wit: class B; the same type of transistors, to wit: NPN types; and a particular common electrode configuration, to wit: a common emitter configuration, as well as a particular bias value thereat, to wit: zero or grounded bias, it is obvious that the invention may be practiced in other kinds of push-pull semiconductor circuits such as, for example, push-pull semiconductor oscillator circuits, etc. and/or these other circuits or the circuit of FIG. 1 may be modified as is apparent to those skilled in the art to utilize other kinds of semiconductor devices such as, for example, photosensitive semiconductor devices, silicon control semiconductor switching devices of the type having a gate, anode and cathode electrodes, etc. Furthermore, as is apparent to those skilled in the art, these other circuits and/or the circuit of FIG. 1 may be modified to employ other operational modes such as, for example, class A, class AB or class C; and/or to utilize other similar electrodes as the common electrodes of the particular semiconductor devices such as, for example, in the case of transistorized circuits, a common base or a common collector configuration, as well as employing other bias values at the common electrodes selected. In addition, in the case of transistorized push-pull circuits utilizing the principles of the invention, the circuits may be modified to utilize a pair of PNP type transistors or to utilize complementary symmetry as is apparent to those skilled in the art, in which cases the various polarities of the bias and feedback voltages would be made compatible to the transistor types selected, and the feedback rectifiers would be poled accordingly.

Thus, while the invention has been particularly shown and described with reference to a preferred embodiment, it will be understood by those skilled in the art that the foregoing and other changes in form and details may be made therein without departing from the spirit and scope of the invention.

What is claimed is:

1. A semiconductor push-pull circuit, comprising:

first and second semiconductor devices having minority carrier storage characteristics, each of said semiconductor devices having an input electrode, an output electrode, and a third common electrode, input means coupled to said input electrodes and said common electrodes, output means coupled to said output electrodes and said common electrodes, a source of input signal coupled to said input means, said input signal alternately rendering said first and second semiconductor devices in conductive conditions, and feedback means responsive to a signal produced by each of the respective minority carrier storages of said first and second semiconductor devices to maintain said second semiconductor device in a nonconducting condition during the storage time of said first semiconductor device and to maintain the first semiconductor device in a nonconducting condition during the storage time of said second semiconductor device.

2. A semiconductor push-pull circuit according to claim 1, wherein:

said output means comprises a transformer having input and output windings, respectively, associated therewith, said input winding being coupled across said output electrodes, and said feedback means comprising first and second feedback windings inductively coupled to said transformer, and first and second rectifier means coupled, respectively, to said first and second feedback windings, one of said feedback windings and rectifier means serially connected thereto being coupled to the input electrode of one of said semiconductor devices, the other of said feedback windings and the rectifier means serially connected thereto being coupled to the input electrode of the other of said semiconductor devices.

3. A semiconductor push-pull circuit according to claim 2, wherein:

said first and second semiconductor devices comprise first and second transistors, respectively, said input electrodes comprising the bases of said transistors, the output electrode comprising the collectors of said transistors, and the common electrodes comprising the emitters of said transistors.

4. A semiconductor push-pull circuit according to claim 3 wherein said transistors are of the same conductivity type.

5. A semiconductor push-pull circuit according to claim 4 wherein said source of input signal provides a symmetrical pulse signal across the input electrodes of said transistors.

References Cited

FOREIGN PATENTS 576,390 5/1958 Italy.

ROY LAKE, *Primary Examiner.*

L. J. DAHL, *Assistant Examiner.*

U.S. Cl. X.R.

330—26